United States Patent
Yu et al.

(10) Patent No.: US 10,679,951 B2
(45) Date of Patent: *Jun. 9, 2020

(54) CHIP-ON-SUBSTRATE PACKAGING ON CARRIER

(71) Applicant: Taiwan Semiconductor Manufacturing Company, Ltd., Hsinchu (TW)

(72) Inventors: Chen-Hua Yu, Hsinchu (TW); Tzu-Shiun Sheu, Hsinchu (TW); Shin-Puu Jeng, Hsinchu (TW); Shih-Peng Tai, Xinpu Township (TW); An-Jhih Su, Taoyuan (TW); Chi-Hsi Wu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/229,250

(22) Filed: Dec. 21, 2018

(65) Prior Publication Data

US 2019/0115307 A1 Apr. 18, 2019

Related U.S. Application Data

(63) Continuation of application No. 15/919,897, filed on Mar. 13, 2018, now Pat. No. 10,163,822, which is a (Continued)

(51) Int. Cl.
*H01L 21/56* (2006.01)
*H01L 23/00* (2006.01)
(Continued)

(52) U.S. Cl.
CPC .......... *H01L 23/562* (2013.01); *H01L 21/486* (2013.01); *H01L 21/4853* (2013.01); (Continued)

(58) Field of Classification Search
CPC ... H01L 23/562; H01L 21/78; H01L 21/6835; H01L 21/568; H01L 21/561; H01L 24/16; (Continued)

(56) References Cited

U.S. PATENT DOCUMENTS 6,359,340 B1 * 3/2002 Lin ...................... H01L 25/0657
257/723
6,473,310 B1 10/2002 Casati et al.
(Continued)

OTHER PUBLICATIONS

Blackwell, "The Electronic packaging handbook," Chapter 5, Circut Boards, 2000, 5 pages.

*Primary Examiner* — Sitaramarao S Yechuri
(74) *Attorney, Agent, or Firm* — Slater Matsil, LLP

(57) ABSTRACT

A method includes mounting a wafer-level package substrate over a carrier, and pre-cutting the wafer-level package substrate to form trenches extending from a top surface of the wafer-level package substrate into the wafer-level package substrate. A plurality of dies is bonded over the wafer-level package substrate. The plurality of dies is molded in a molding material to form a wafer-level package, with the wafer-level package including the wafer-level package substrate, the plurality of dies, and the molding material. The carrier is detached from the wafer-level package. The wafer-level package is sawed into a plurality of packages, with each of the plurality of packages including a portion of the wafer-level package substrate and one of the plurality of dies.

20 Claims, 8 Drawing Sheets

Related U.S. Application Data continuation of application No. 15/379,769, filed on Dec. 15, 2016, now Pat. No. 9,922,943, which is a continuation of application No. 14/132,709, filed on Dec. 18, 2013, now Pat. No. 9,524,942.

(51) Int. Cl.
| | | |
|---|---|---|
| *H01L 21/683* | (2006.01) | |
| *H01L 21/48* | (2006.01) | |
| *H01L 21/78* | (2006.01) | |
| *H01L 23/31* | (2006.01) | |
| *H01L 23/498* | (2006.01) | |
| *H01L 25/065* | (2006.01) | |
| *H01L 25/00* | (2006.01) | |
| *H01L 25/18* | (2006.01) | |

(52) U.S. Cl.
CPC .......... *H01L 21/561* (2013.01); *H01L 21/565* (2013.01); *H01L 21/568* (2013.01); *H01L 21/6835* (2013.01); *H01L 21/78* (2013.01); *H01L 23/3114* (2013.01); *H01L 23/49827* (2013.01); *H01L 24/02* (2013.01); *H01L 24/03* (2013.01); *H01L 24/16* (2013.01); *H01L 24/80* (2013.01); *H01L 24/95* (2013.01); *H01L 24/97* (2013.01); *H01L 25/0657* (2013.01); *H01L 25/50* (2013.01); *H01L 21/6836* (2013.01); *H01L 23/3128* (2013.01); *H01L 24/81* (2013.01); *H01L 25/18* (2013.01); *H01L 2221/68331* (2013.01); *H01L 2221/68381* (2013.01); *H01L 2224/06181* (2013.01); *H01L 2224/16145* (2013.01); *H01L 2224/16225* (2013.01); *H01L 2224/16227* (2013.01); *H01L 2224/16238* (2013.01); *H01L 2224/17181* (2013.01); *H01L 2224/32145* (2013.01); *H01L 2224/32225* (2013.01); *H01L 2224/73204* (2013.01); *H01L 2224/81005* (2013.01); *H01L 2224/95* (2013.01); *H01L 2225/06513* (2013.01); *H01L 2225/06517* (2013.01); *H01L 2225/06541* (2013.01); *H01L 2225/06548* (2013.01); *H01L 2225/06555* (2013.01); *H01L 2225/06562* (2013.01); *H01L 2225/06582* (2013.01); *H01L 2924/12042* (2013.01); *H01L 2924/15159* (2013.01); *H01L 2924/15311* (2013.01); *H01L 2924/181* (2013.01); *H01L 2924/3511* (2013.01); *H01L 2924/3512* (2013.01)

(58) Field of Classification Search
CPC ... H01L 21/486; H01L 24/95; H01L 23/3114; H01L 23/49827; H01L 25/0657; H01L 25/50; H01L 21/4853; H01L 21/565; H01L 24/97; H01L 24/02; H01L 24/03; H01L 24/80; H01L 24/81; H01L 21/6836; H01L 2225/06548; H01L 2225/06562; H01L 2225/06541; H01L 23/3128; H01L 2924/15159; H01L 2225/06517; H01L 2224/95; H01L 2224/81005; H01L 2224/32145; H01L 2224/17181; H01L 2224/16238; H01L 2225/06513; H01L 2924/3512; H01L 2224/06181; H01L 2221/68381; H01L 2221/68331; H01L 25/18; H01L 2224/16227; H01L 2225/06555; H01L 2225/06582; H01L 2924/3511; H01L 2224/32225; H01L 2224/16225; H01L 2924/15311; H01L 2224/16145; H01L 2924/12042; H01L 2924/181; H01L 2224/73204

See application file for complete search history.

(56) References Cited

U.S. PATENT DOCUMENTS

| | | | |
|---|---|---|---|
| 7,405,474 B1 | 7/2008 | Brophy | |
| 9,524,942 B2 | 12/2016 | Yu et al. | |
| 2004/0245652 A1 | 12/2004 | Ogata | |
| 2007/0152313 A1* | 7/2007 | Periaman | H01L 25/0657 257/686 |
| 2008/0179611 A1 | 7/2008 | Chitnis et al. | |
| 2008/0203511 A1 | 8/2008 | Huang et al. | |
| 2008/0272464 A1 | 11/2008 | Do et al. | |
| 2008/0272465 A1* | 11/2008 | Do | H01L 21/6835 257/620 |
| 2008/0315434 A1 | 12/2008 | McElrea et al. | |
| 2010/0109132 A1 | 5/2010 | Ko et al. | |
| 2011/0006404 A1 | 1/2011 | Lee et al. | |
| 2011/0147925 A1 | 6/2011 | van Kempen et al. | |
| 2011/0250721 A1* | 10/2011 | Bowles | H01L 23/3114 438/107 |
| 2012/0013004 A1* | 1/2012 | Suthiwongsunthorn | H01L 21/561 257/737 |
| 2012/0032340 A1 | 2/2012 | Choi et al. | |
| 2012/0074585 A1* | 3/2012 | Koo | H01L 21/486 257/774 |
| 2012/0241955 A1 | 9/2012 | Law et al. | |
| 2013/0127044 A1 | 5/2013 | Poddar et al. | |
| 2013/0249115 A1* | 9/2013 | Lin | H01L 23/13 257/777 |
| 2014/0077363 A1 | 3/2014 | Lin et al. | |
| 2015/0014855 A1 | 1/2015 | Yap et al. | |

\* cited by examiner

CHIP-ON-SUBSTRATE PACKAGING ON CARRIER

PRIORITY CLAIM AND CROSS-REFERENCE

This application is a continuation of U.S. patent application Ser. No. 15/919,897, entitled "Chip-on-Substrate Packaging on Carrier," filed on Mar. 13, 2018, which is a continuation of U.S. patent application Ser. No. 15/379,769, entitled "Chip-on-Substrate Packaging on Carrier," filed on Dec. 15, 2016, now U.S. Pat. No. 9,922,943 issued Mar. 20, 2018, which is a continuation of U.S. patent application Ser. No. 14/132,709, entitled "Chip-on-Substrate Packaging on Carrier," filed on Dec. 18, 2013, now U.S. Pat. No. 9,524,942 issued Dec. 20, 2016, which applications are incorporated herein by reference.

BACKGROUND

In the packaging of integrated circuits, device dies are packaged onto package substrates, which include metal connections that are used to route electrical signals between opposite sides of the package substrates. The device dies may be bonded onto one side of a package substrate using flip chip bonding, and a reflow is performed to melt the solder balls that interconnect the dies and the package substrate.

The package substrates may use organic materials such as materials that can be easily laminated. These materials, however, are prone to the warpage caused by the elevated temperatures used in the reflow of the solder. Furthermore, during the bonding process, since the dies and the package substrates have significantly different Coefficients of Thermal Expansion (CTEs), the warpage in the device dies and the package substrates is worsened. For example, the silicon in the dies may have a CTE of 3.2 ppm/° C., while the package substrates may have a CTE between about 17 ppm/° C. and 20 ppm/° C., or even higher. The warpage in the package substrates may cause irregular joints and/or bump cracks. As a result, the yield of the packaging process is adversely affected.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A Chip-on-Substrate (CoS) package (which may also be a Chip-on-Chip-on-Substrate (CoCoS) package) and the method of forming the same are provided. The intermediate stages of forming the package in accordance with some embodiments are illustrated. The variations of the embodiments are discussed. Throughout the various views and illustrative embodiments, like reference numbers are used to designate like elements.

Figure 1:
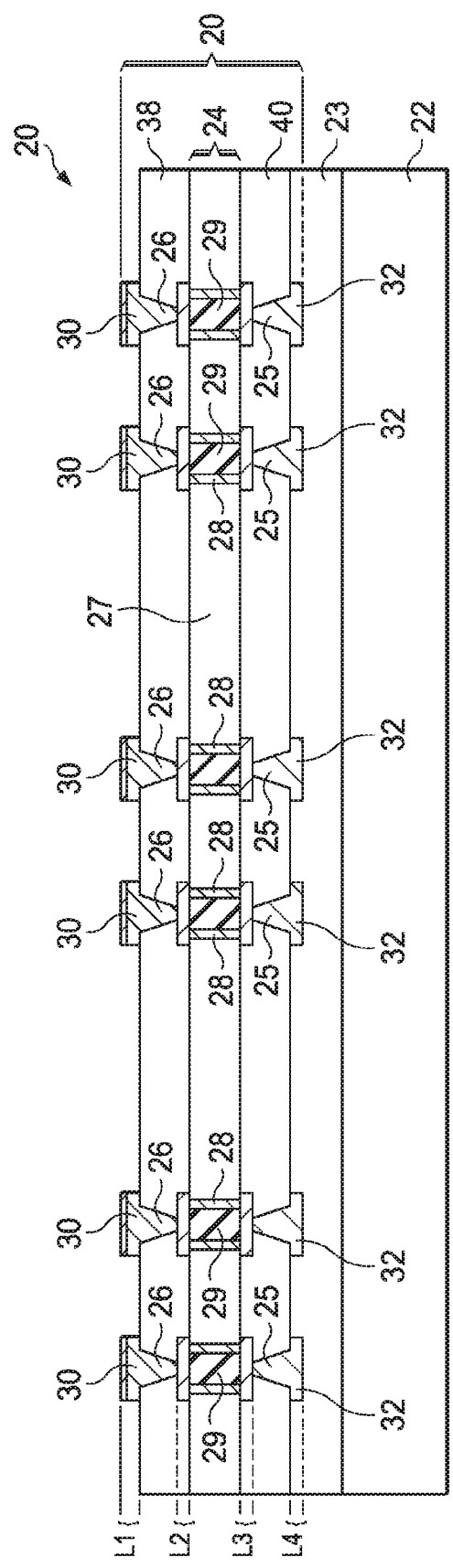
FIGS. 1 through 8 are cross-sectional views of intermediate stages in the formation of a package in accordance with some exemplary embodiments, wherein a wafer-level package substrate is adhered on a carrier and pre-cut before device dies are bonded thereon.

FIGS. 1 through 8 illustrate the cross-sectional views and a top view of intermediate stages in the formation of a package in accordance with some exemplary embodiments. Referring to FIG. 1, wafer-level package substrate 20 is adhered on carrier 22 through adhesive 23. In some embodiments, carrier 22 is a glass carrier, a ceramic carrier, or the like, which may be formed of a homogenous material. Alternatively, carrier 22 is a blank silicon carrier that has no integrated circuits formed thereon. Adhesive 23 may be a Ultra-Violet (UV) adhesive, which loses adhesion when exposed to UV light.

In some exemplary embodiments, wafer-level package substrate 20 is a build-up substrate that is built up from a core. In alternative embodiments, wafer-level package substrate 20 is a laminate substrate that includes conductive traces embedded in laminated dielectric films. In the subsequent discussion of the embodiments of the present disclosure, a build-up substrate is illustrated as an example, while the teaching revealed in accordance with the exemplary embodiments are readily applicable for laminate substrates.

In the exemplary embodiments that wafer-level package substrate 20 is a build-up substrate, wafer-level package substrate 20 includes core 24, and metal layers formed on the opposite sides of core 24. Throughout the description, the term "metal layer" refers to the collection of all metal features, including, and not limited to, metal traces and metal pads, that are at the same level. The corresponding parts/layers of the metal features in the same metal layer are formed of the same materials that have the same compositions. For example, all metal features in a metal layer may include a copper layer. Alternatively, a metal layer includes a copper layer and a nickel layer over the copper layer. In some exemplary embodiments as shown in FIG. 1, wafer-level package substrate 20 includes metal layers L2 overlying core 24, and metal layer L1 over metal layer L2. Wafer-level package substrate 20 further includes metal layer L3 underlying core 24, and metal layer L4 underlying metal layer L3.

Package substrate 20 may include one or more metal layers on each side of core 24. For example, in the exemplary embodiments shown in FIG. 1, there are two metal layers on each side of core 24. Metal layers L1, L2, L3, and L4 are electrically interconnected through metal vias 25, 26, and 28. Accordingly, metal traces 30, which are parts of metal layer L1, are electrically connected to metal pads 32, which are parts of metal layer L4. The metal features in metal layers L1, L2, L3, and L4 may comprise copper, aluminum, nickel, gold, or combinations thereof. Core 24 includes core dielectric layer 27, and metal vias 28 penetrating through core dielectric layer 27. In some embodiments, core dielectric layer 27 comprises one or more material selected from epoxy, resin, glass fiber, molding compound, plastic (such as PolyVinylChloride (PVC), Acrylonitril, Butadiene & Styrene (ABS), Polypropylene (PP), Polyethylene (PE), PolyStyrene (PS), Polymethyl Methacrylate (PMMA), Polyethylene Terephthalate (PET), Polycarbonates (PC), Polyphenylene sulfide (PPS), combinations thereof, and multi-layers thereof. Metal vias 28 may be formed as conductive pipes in some exemplary embodiments. The internal volumes of metal vias 28 are filled with dielectric filling 29, which may be a material selected from the same candidate materials for forming core dielectric layer 27. In alternative embodiments, conductive pipes 28 comprise air gaps therein. Metal vias 28 electrically interconnect, and may be in physical contact with, the metal features in metal layers L2 and L3.

Dielectric layer 38 is formed over core 24, with the vias 26 that interconnect metal layers L1 and L2 disposed in dielectric layer 38. Dielectric layer 38 may be formed of PP in some exemplary embodiments, while other dielectric materials may also be used. Dielectric layer 40 is formed under core 24, with the vias 25 that interconnect metal layers L3 and L4 disposed in dielectric layer 40. Dielectric layer 40 may also be formed of PP in some exemplary embodiments, while other dielectric materials may also be used.

Figure 2A:
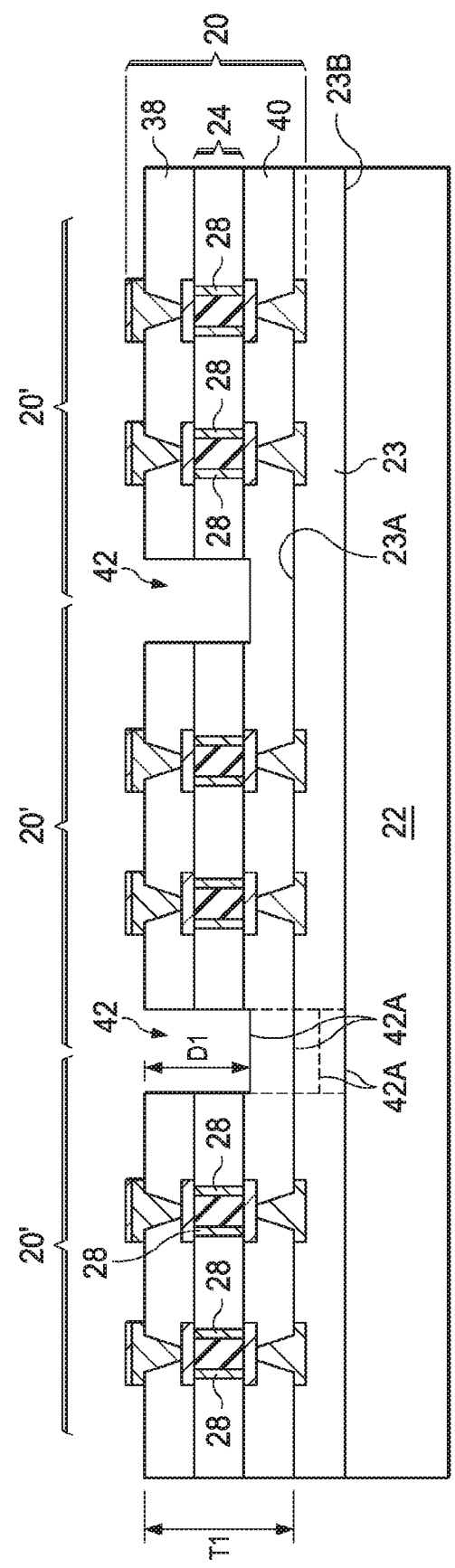

Referring to FIG. 2A, a pre-cut is performed to cut through some parts of wafer-level package substrate 20, so that trenches 42 are formed. In some embodiments, the pre-cut is a partial pre-cut, wherein a top portion of wafer-level package substrate 20 is cut, and a bottom portion of wafer-level package substrate 20 is not cut, as illustrated in FIG. 2A. Accordingly, bottom surfaces 42A of trenches 42 are at an intermediate level between the top surface and the bottom surface of wafer-level package substrate 20. In alternative embodiments, the pre-cut is a full pre-cut, wherein after the pre-cut, wafer-level package substrate 20 is cut through. In some embodiments in which the full pre-cut is performed, bottom surfaces 42A of trenches 42 are level with top surface 23A of adhesive 23. In alternative embodiments, bottom surfaces 42A (also shown as dashed) of trenches 42 are at an intermediate level between top surface 23A and bottom surface 23B of adhesive 23. In yet other embodiments, adhesive 23 is substantially cut through in the pre-cut step, and bottom surfaces 42A of trenches 42 are substantially level with bottom surfaces 23B of adhesive 23. The pre-cut may be performed using laser or a blade. In some embodiments, bottom surfaces 42A are substantially planar, and may be parallel to the major top surface and bottom surface of package substrate 20.

Since the material of wafer-level package substrate 20 is different from the material of carrier 22, wafer-level package substrate 20 and carrier 22 have different Coefficients of Thermal Expansion (CTEs). The CTE of wafer-level package substrate 20 may be significantly greater than the CTE of carrier 22. For example, carrier 22 may have a CTE equal to about 3 ppm/° C., while wafer-level package substrate 20 may have a CTE greater than about 10 ppm/° C. With the difference between the CTEs of carrier 22 and wafer-level package substrate 20, stresses may be generated in wafer-level package substrate 20. The pre-cut helps release the stress.

In some exemplary embodiments, trenches 42 extend below the bottom surface 24A of core 24. Furthermore, depth D1 of trenches 42 may be greater than about 50 percent thickness T1 of package substrate 20. Depth D1 may also be in the range between about 50 percent and about 80 percent thickness T1. It is appreciated, however, that the values recited throughout the description are merely examples, and may be changed to different values. Since core dielectric layer 27 in core 24 may be more rigid (with a higher hardness) compared to other dielectric layers in wafer-level package substrate 20, sawing through core 24 improves the stress release effect of wafer-level package substrate 20.

Figure 2B:
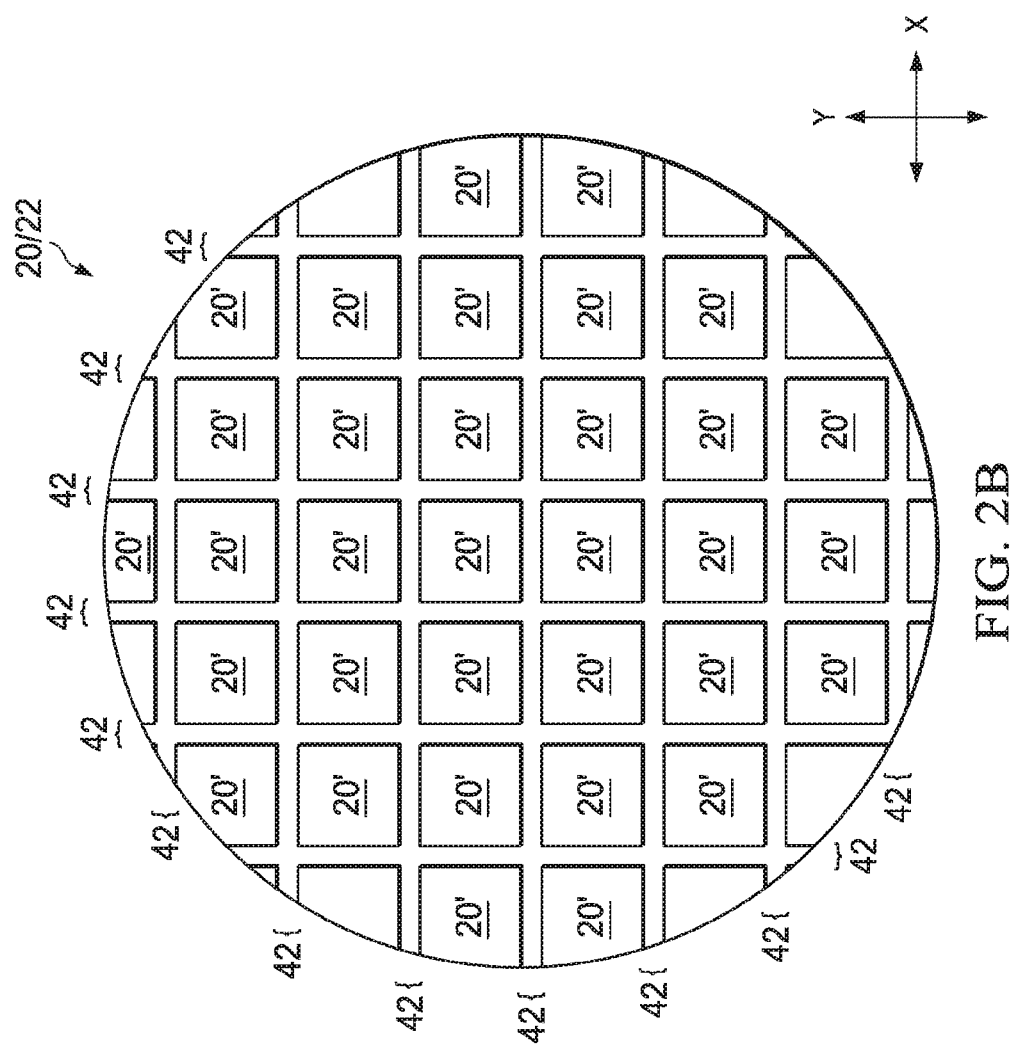

FIG. 2B illustrates a top view of FIG. 2A. In some embodiments, as shown in FIG. 2A, wafer-level package substrate 20 and carrier 22 have a round shape. The sizes of wafer-level package substrate 20 and carrier 22 may be the same as the common sizes of semiconductor wafers, which sizes may be 8 inches, 12 inches, or the like. Trenches 42 form a grid, with a plurality of trenches 42 extending parallel to the X direction, and a plurality of trenches 42 extending parallel to the Y direction. Trenches 42 define package substrates 20', which are portions of wafer-level package substrate 20.

Figure 3:
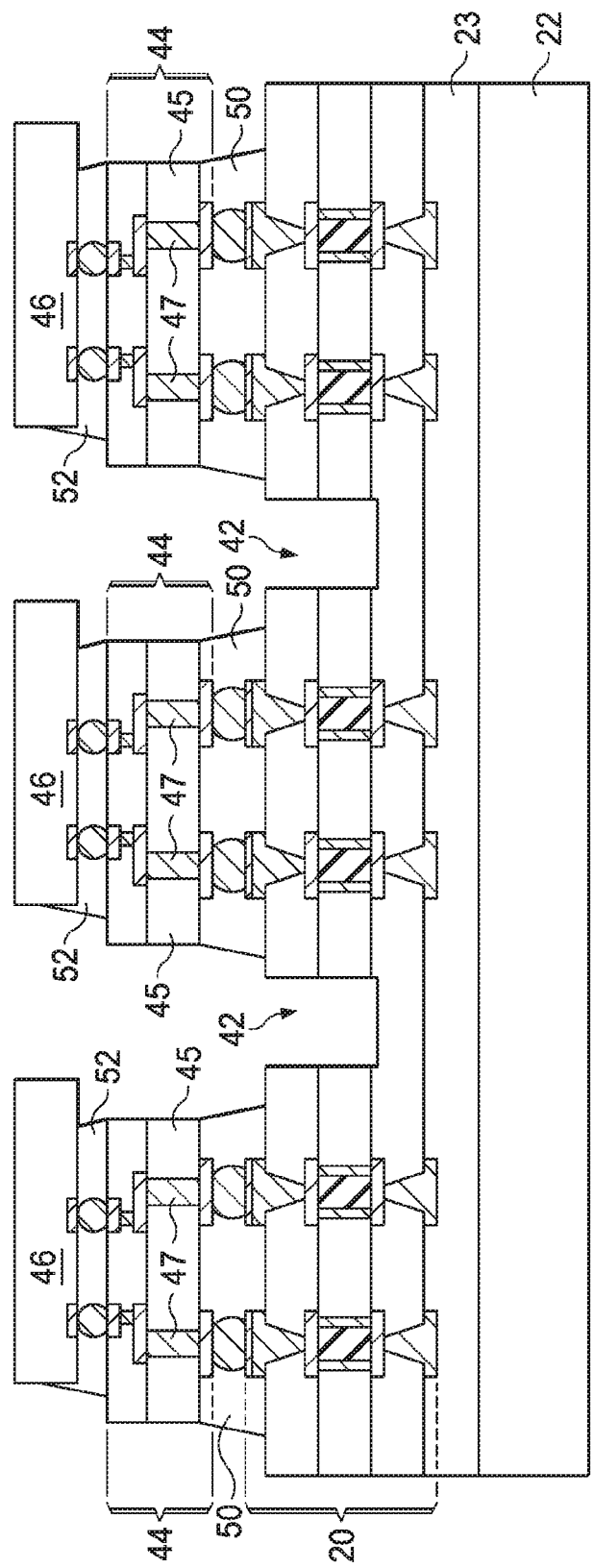

Referring to FIG. 3, dies 44 and 46 are bonded to wafer-level package substrate 20. Package components 44 and 46 may be device dies, which may include logic device dies, memory device dies, or the like. Hence, throughout the description, package components 44 and 46 are referred to as device dies 44 and 46, respectively, although they may also be other types of package components such as packages, for example. In some embodiments, device dies 44 and 46 include integrated circuit devices (not shown), such as transistors, capacitors, inductors, resistors, and the like, therein. Device dies 44 may include semiconductor substrate 45, and Through Vias (TV, sometimes referred to as through-silicon vias or through-semiconductor vias) 47 penetrating through semiconductor substrate 45. Accordingly, the integrated circuit devices in device dies 46 may be electrically coupled to (as illustrated in FIG. 3) the conductive features in wafer-level package substrate 20 through TVs 47.

The bonding between dies 44 and wafer-level package substrate 20 and the bonding between dies 46 and dies 44 may be solder bonding or direct metal-to-metal (such as a copper-to-copper) bonding. Underfill 50 is dispensed into the gaps between dies 44 and wafer-level package substrate 20, and underfill 52 is dispensed into the gaps between dies 44 and 46. The resulting structure shown in FIG. 3 is referred to as a Chip-on-Chip-on-Substrate (CoCoS) package. In alternative embodiments, there is no die over and bonded to dies 44, and the resulting package is a Chip-on-Substrate (CoS) package.

In some embodiments, chips 46 extend beyond the edges of dies 44, and hence dies 46 are referred to as having overhang. FIG. 3 illustrates that a die 46 has an overhang on one side of the respective underlying die 44. In alternative embodiments, dies 46 may overhang on opposite sides of the respective underlying dies 44.

Figure 4:
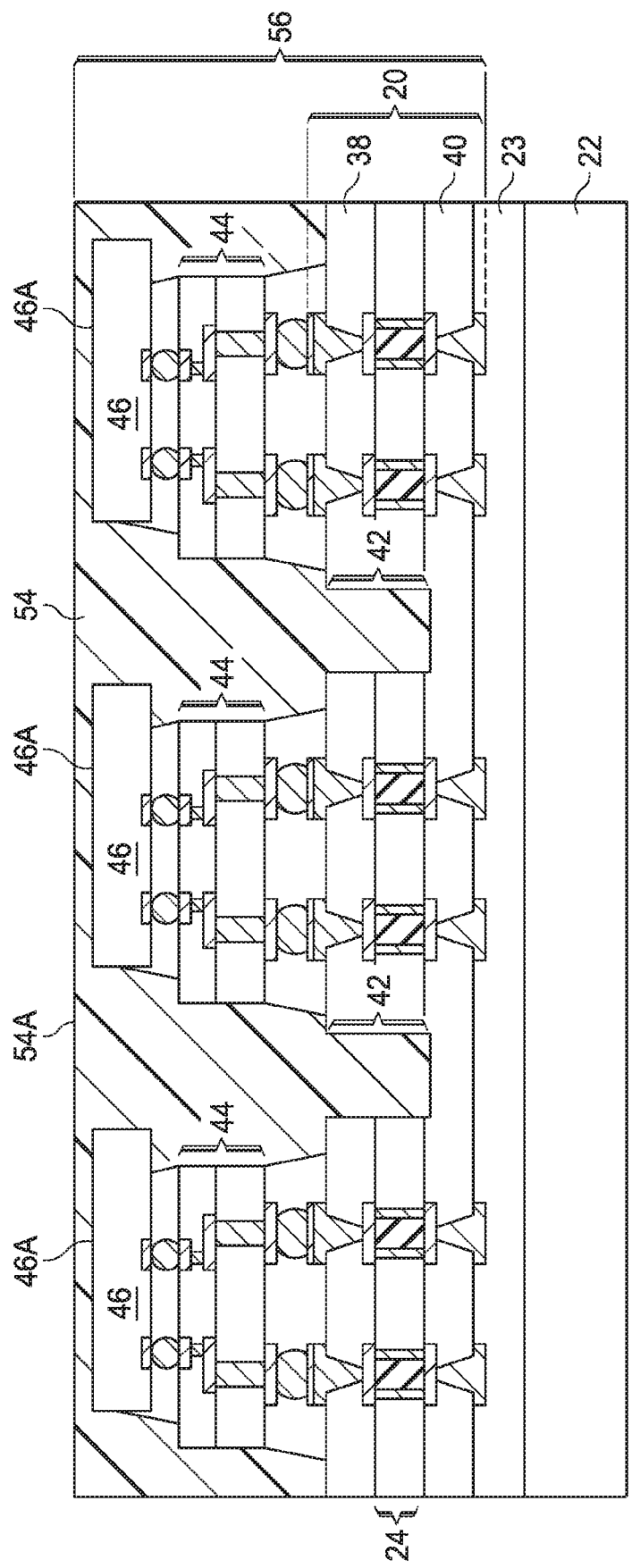

Referring to FIG. 4, molding material 54 (which may be a polymer) is molded onto dies 44 and 46 and wafer-level package substrate 20. In some embodiments, polymer 54 comprises a molding compound, and hence is referred to as molding compound 54 hereinafter, although it may also be formed of other types of polymers such as epoxy, molding underfill, or the like. Molding compound 54 is further filled into trenches 42. After the curing of molding compound 54, a grinding step may be performed on molding compound 54 to level the top surface of molding compound 54. In the resulting structure, top surface 54A of molding compound 54 may be higher than or level with top surfaces 46A of dies 46.

In alternative embodiments, instead of applying underfills 50 and 52 and molding compound 54 in separate steps, wherein the dispensing of each of underfills 50 and 52 and the molding compound 54 is accompanied by a curing process, a molding underfill is used to replace underfills 50 and 52 and molding compound 54. Accordingly, the molding underfill fills the gaps between dies 44 and 46 and wafer-level package substrate 20, and also fills the gaps between dies 44 and 46. After the dispensing of the molding underfill, a curing step is performed. Throughout the description, the structure including wafer-level package substrate 20, dies 44 and 46, and the molding/underfill material in FIG. 4 is referred to as wafer-level package 56.

Figure 5:
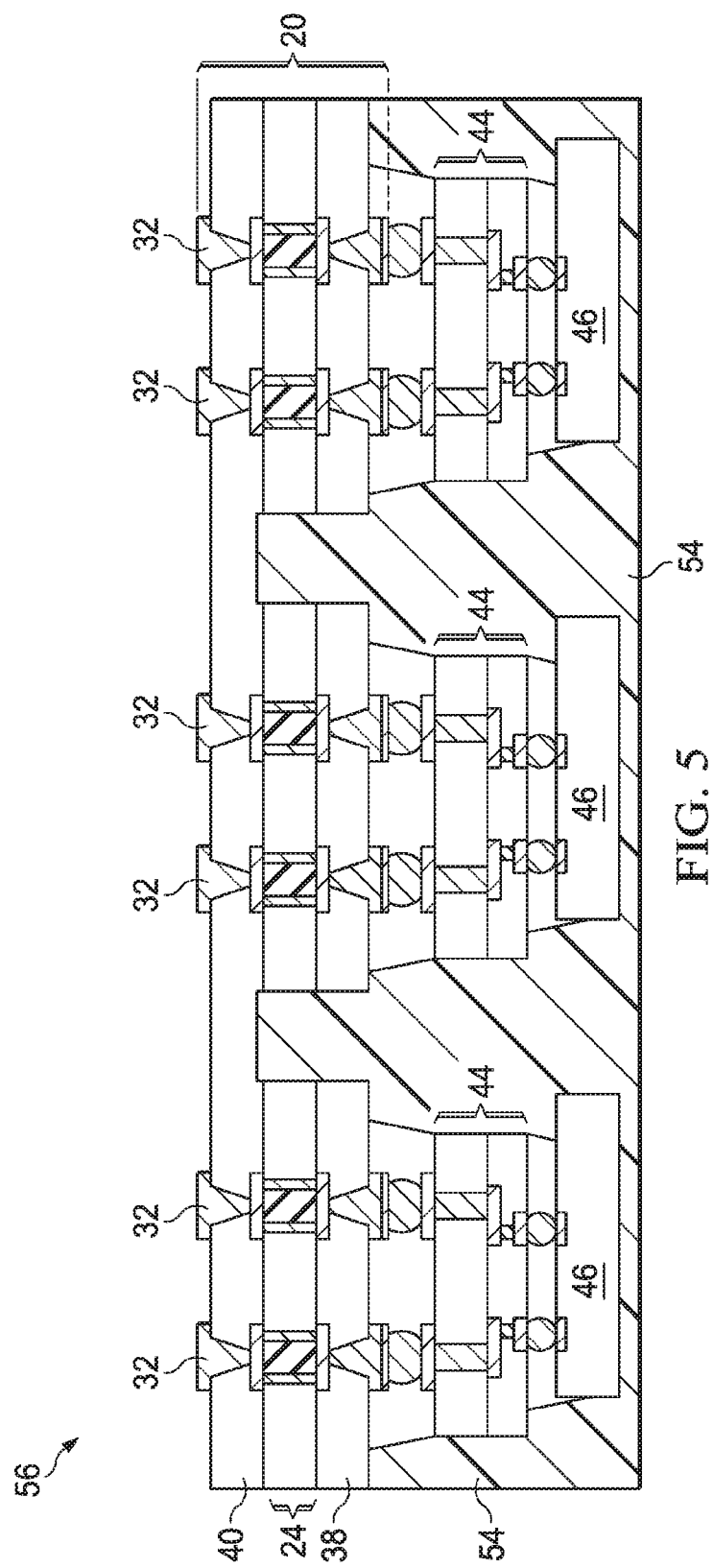

Next, wafer-level package 56 is demounted from carrier 22. For example, in the embodiments wherein adhesive 23 (FIG. 4) is a UV glue, a UV light penetrates through carrier 22, which is transparent to the UV light, and is projected on adhesive 23. Adhesive 23 loses adhesion due to the UV light. The residue of adhesive 23 left on wafer-level package substrate 20 is then cleaned. FIG. 5 illustrates the resulting wafer-level package 56.

Figure 6:
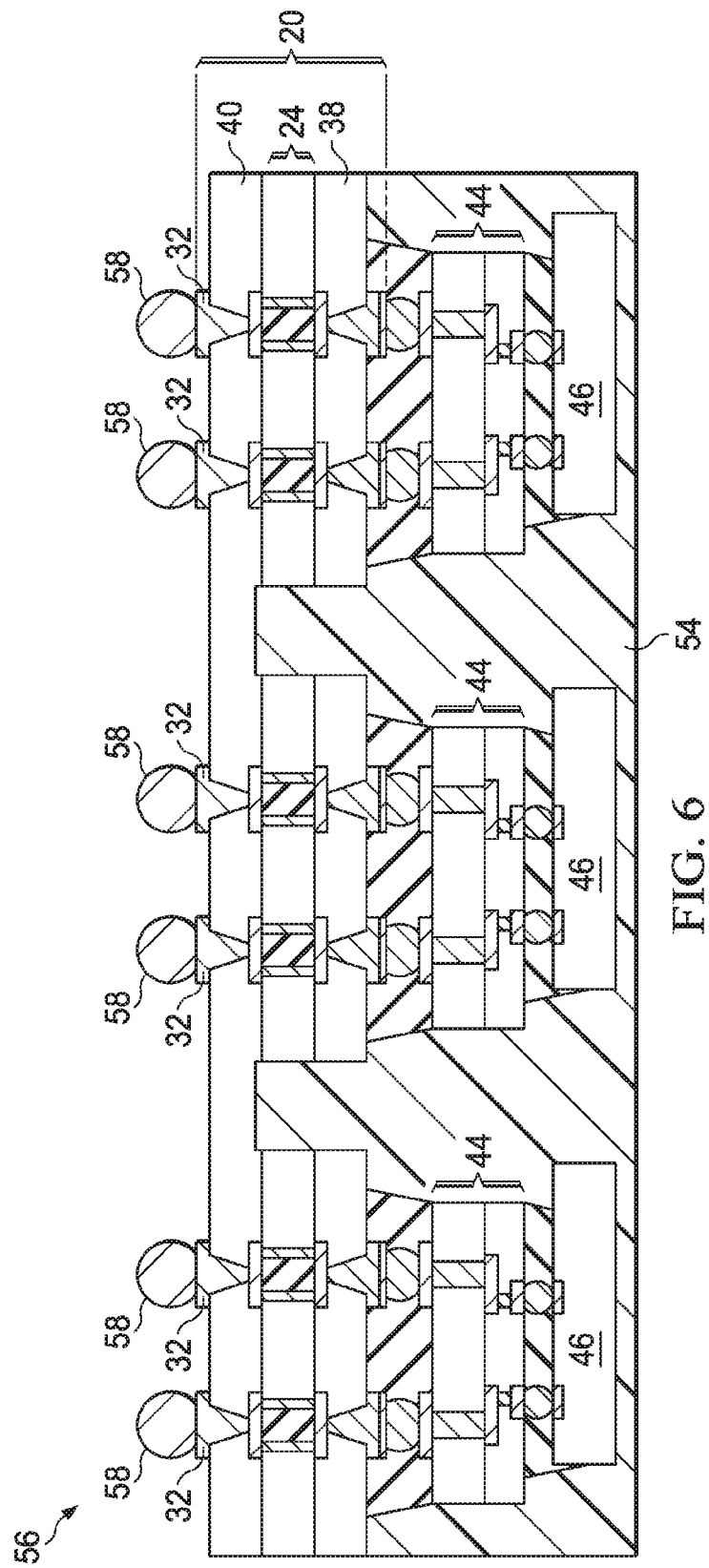

FIG. 6 illustrates the formation of connectors 58. The respective step is sometimes referred to as ball mount. In some exemplary embodiments, the formation of connectors 58 includes placing solder balls on the exposed portions of the conductive features (such as traces 32) on wafer-level package 56, and then reflowing the solder balls. In alternative embodiments, the formation of connectors 58 includes performing a plating step to form solder regions on the conductive features on wafer-level package 56, and then reflowing the solder regions to form solder balls. Connectors 58 may also comprise metal pillars, or metal pillars and solder caps, which may also be formed through plating.

Figure 7:
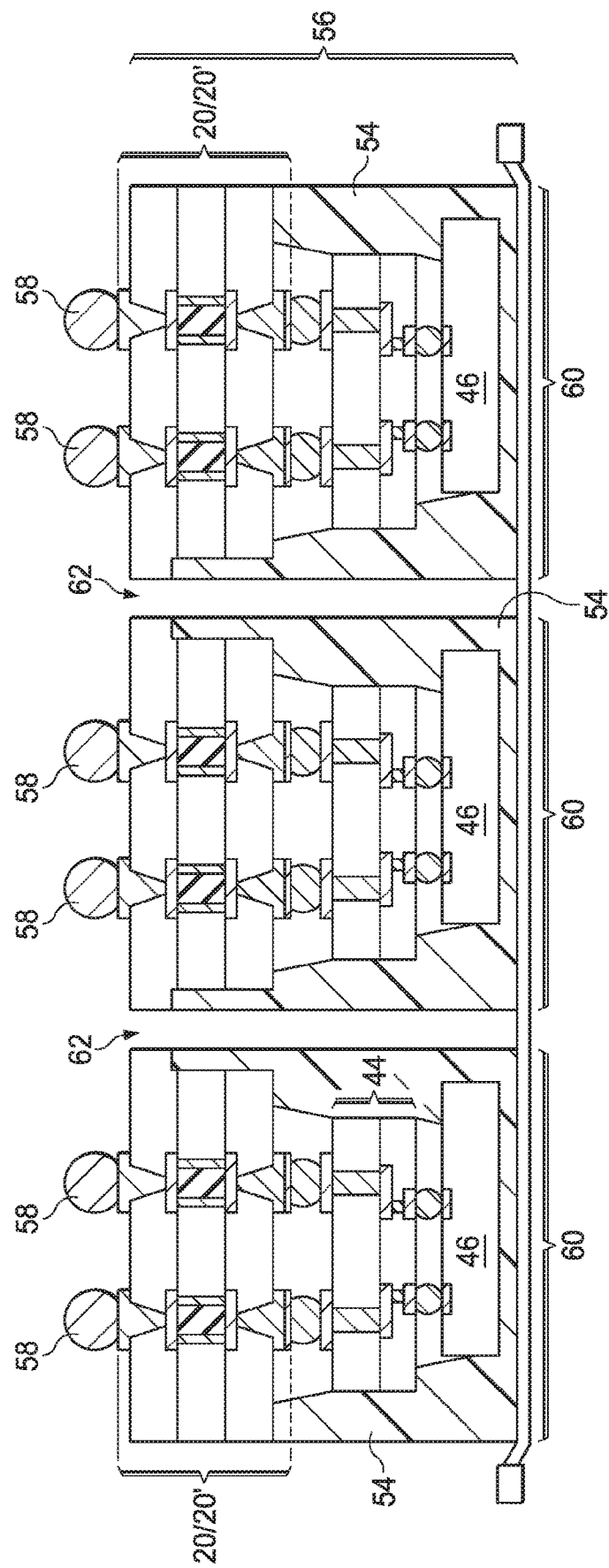

After the formation of connectors 58, as shown in FIG. 7, a die-saw is performed to saw wafer-level package 56 apart, so that packages 60 are formed. Each of packages 60 includes a portion (referred to as package substrate 20' hereinafter) of wafer-level package substrate 20, and dies 44 and 46 bonded thereon. In some embodiments, kerfs 62 of the die-saw are narrower than trenches 42 (FIGS. 2A and 2B). As a result, portions of molding compound 54 that fills trenches 42 are left un-removed by the die saw. In alternative embodiments, kerfs 62 of the die-saw have the same width as trenches 42 (FIG. 2). In yet alternative embodiments, kerfs 62 of the die-saw are wider than trenches 42 (FIG. 2), and hence no molding compound 54 is left on the sidewalls of package substrates 20'.

Figure 8:
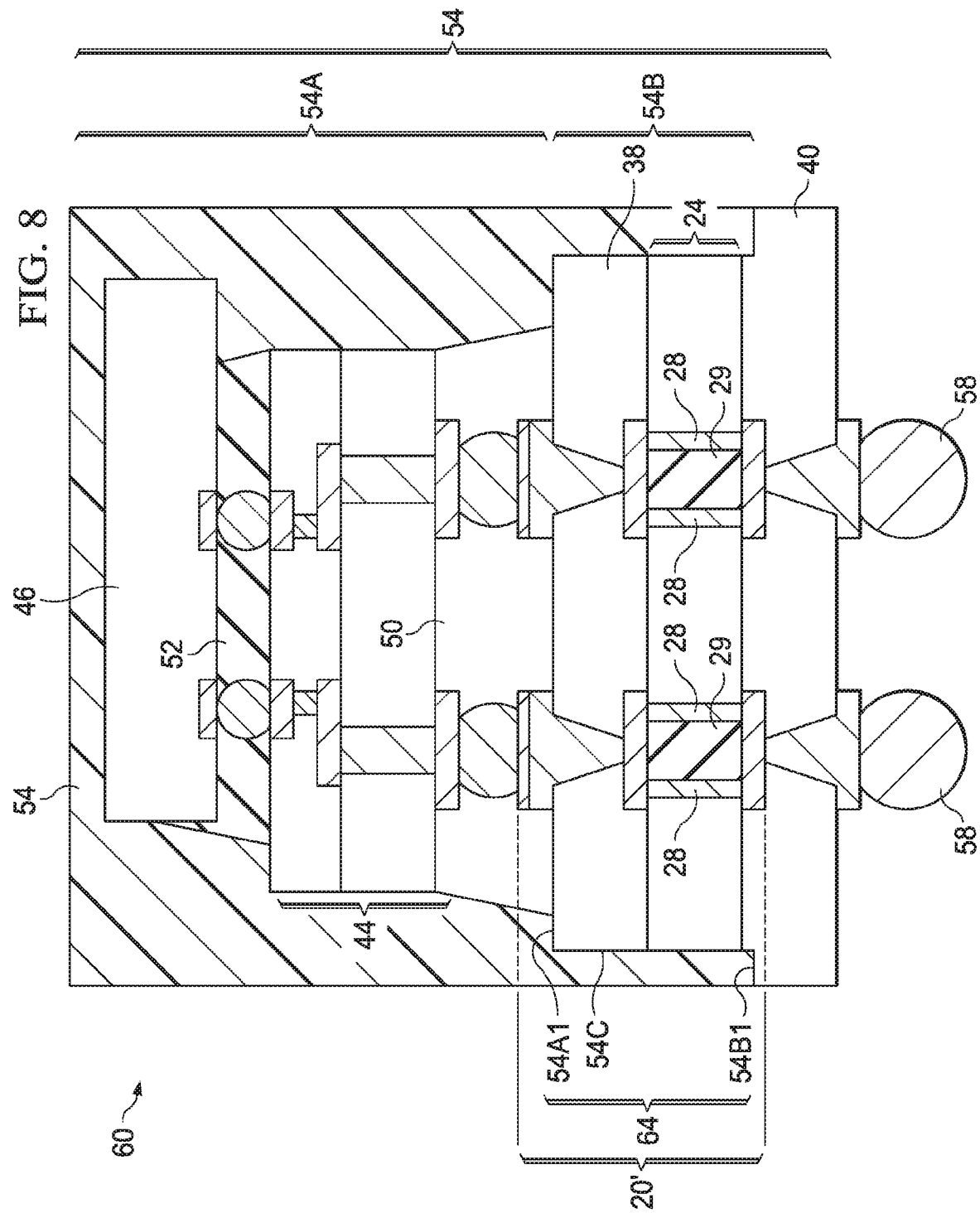

FIG. 8 illustrates package 60 in accordance with the embodiments of the present disclosure. As shown in FIG. 8, molding compound 54 includes portion 54A encircling dies 44 and 46. Portion 54A of molding compound 54 is further in contact with the sidewalls of dies 44 and 46. Molding compound 54 further includes portion 54B encircling package substrate 20'. Portion 54B of molding compound 54 is further in contact with the sidewalls of the top portion of package substrate 20'. On the other hand, the bottom surface of molding compound portion 54B is in contact with a top surface of dielectric layer 40 in package substrate 20'. Accordingly, step 64 is formed, as shown in the cross-sectional view of package 60. The step 64 includes bottom surface 54A1 of molding compound portion 54A, bottom surface 54B1 of molding compound portion 54B, and sidewall 54C of molding compound portion 54B. Due to the step, molding compound 54 has an improved adhesion to package substrate 20' than if step 64 is not formed. Furthermore, Portion 54B of molding compound 54 encircles, and in contact with, core 24 of package substrate 20' in some embodiments.

The embodiments of the present disclosure have some advantageous features. By forming the CoCos package on a carrier, it is possible to pre-cut the package substrate before bonding dies onto the package substrate. Accordingly, the stress in the package substrate has already been released when the bonding is performed. This results in the improved reliability in the resulting package and reduced difficulty in the bonding. The formation of the step helps prevent molding compound 54 from delaminating from package substrate 20'.

The carrier and the package substrate may have top-view shapes and sizes the same as semiconductor wafers. Accordingly, the tools and the process steps that are used for forming devices on semiconductor wafers are readily usable for the formation of the CoCoS packages. Since the packaging is performed at the wafer level, there is better process uniformity and quality control.

In accordance with some embodiments, a method includes mounting a wafer-level package substrate over a carrier, and pre-cutting the wafer-level package substrate to form trenches extending from a top surface of the wafer-level package substrate into the wafer-level package substrate. A plurality of dies is bonded over the wafer-level package substrate. The plurality of dies is molded in a molding material to form a wafer-level package, with the wafer-level package including the wafer-level package substrate, the plurality of dies, and the molding material. The carrier is detached from the wafer-level package. The wafer-level package is sawed into a plurality of packages, with each of the plurality of packages including a portion of the wafer-level package substrate and one of the plurality of dies.

In accordance with other embodiments, a method includes performing a partial pre-cutting on a wafer-level package substrate to form trenches in the wafer-level package substrate, wherein bottom surfaces of the trenches are between a top surface and a bottom surface of the wafer-level package substrate. After the pre-cutting, a plurality of dies is bonded over the wafer-level package substrate. The plurality of dies is molded in a molding material to form a wafer-level package, with the wafer-level package including the wafer-level package substrate, the plurality of dies, and the molding material. The wafer-level package is sawed into a plurality of packages.

In accordance with yet other embodiments, a package includes a package substrate having a top surface and a bottom surface, a die over and bonded to the package substrate, and a molding material molding the die therein. The molding material includes a first portion encircling the first die, and a second portion underlying and connected to the first portion. The second portion encircles a top portion of the package substrate. A bottom surface of the second portion of the molding material is at an intermediate level between the top surface and the bottom surface of the package substrate.

One general aspect of embodiments disclosed herein includes a package including: a package substrate including: a first dielectric layer; first conductive features having portions over the first dielectric layer; a second dielectric layer underlying the first dielectric layer; and second conductive features at a bottom surface of the package substrate; and an encapsulant surrounding an upper portion of the package substrate and contacting a top surface of the second dielectric layer, where the encapsulant and the second dielectric layer have sidewalls that are flush with one another.

Another general aspect of embodiments disclosed herein includes a package including: a package substrate including: first conductive features at a top surface of the package substrate; second conductive features at a bottom surface of the package substrate; and a core between the top surface and the bottom surface, where the core includes: a core dielectric layer made of a first dielectric material, the core dielectric layer having a first sidewall and a second sidewall; conductive vias extending through the core dielectric layer; and an upper dielectric layer overlying the core dielectric layer, the upper dielectric layer having a first sidewall flush with the first sidewall of the core dielectric layer, the upper dielectric layer having a second sidewall flush with the second sidewall of the core dielectric layer, a lower dielectric layer underlying the core dielectric layer, the lower dielectric layer having a first sidewall that extends beyond the first sidewall of the core dielectric layer, the upper dielectric layer having a second sidewall that extends beyond the second sidewall of the core dielectric layer; a first die over and bonded to the package substrate; and a molding material molding the first die therein, where the molding material encapsulates the first die, the first and second sidewalls of the upper dielectric layer and the first and second sidewalls of the core dielectric layer, and further where the molding material has a first sidewall that is flush with the first sidewall of the lower dielectric layer and the molding material a second sidewall that is flush with the second sidewall of the lower dielectric layer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package comprising:
   a package substrate comprising:
      a first dielectric layer;
      first conductive features having portions over the first dielectric layer;
      a second dielectric layer underlying the first dielectric layer; and
      second conductive features at a bottom surface of the package substrate;
   a first device die over and bonded to the package substrate;
   a second device die over and bonded to the first device die through flip-chip bonding, wherein the second device die extends beyond a first edge of the first device die, and recedes from a second edge of the first device die, with the first edge and the second edge being opposite edges of the first device die; and
   an encapsulant surrounding an upper portion of the package substrate and contacting a top surface of the second dielectric layer, wherein the encapsulant and the second dielectric layer have sidewalls that are flush with one another, wherein the encapsulant encircles and contacts sidewalls of the first device die, and wherein the encapsulant extends to a level higher than a top surface of the second device die.

2. The package of claim 1, wherein the package substrate comprises:
   conductive through vias electrically coupling the first conductive features to the second conductive features, wherein the second dielectric layer is underlying the conductive through vias.

3. The package of claim 2, wherein the conductive through vias comprise dielectric-filled pipes.

4. The package of claim 2, wherein the package substrate further comprises dielectric regions encircled by the conductive through vias.

5. The package of claim 1, wherein the first dielectric layer has a first hardness that is harder than a hardness of the second dielectric layer.

6. The package of claim 1, comprising a solder region contacting a bottom surface of one of the second conductive features.

7. The package of claim 1, wherein an edge of the encapsulant is flush with an edge of the package substrate.

8. The package of claim 1, wherein the encapsulant comprises a top surface contacting a bottom surface of the second device die to form a horizontal interface.

9. The package of claim 1 further comprising an underfill between the first device die and the second device die, wherein the underfill further extends beyond the first edge of the first device die, and recesses from the second edge of the first device die.

10. A package comprising:
    a package substrate comprising:
       first conductive features at a top surface of the package substrate;
       second conductive features at a bottom surface of the package substrate; and
       a core between the top surface and the bottom surface, wherein the core comprises:
          a core dielectric layer made of a first dielectric material, the core dielectric layer having a first sidewall and a second sidewall;
          conductive vias extending through the core dielectric layer; and
          an upper dielectric layer overlying the core dielectric layer, the upper dielectric layer having a first sidewall flush with the first sidewall of the core dielectric layer, the upper dielectric layer having a second sidewall flush with the second sidewall of the core dielectric layer,
          a lower dielectric layer underlying the core dielectric layer, the lower dielectric layer having a first sidewall that extends beyond the first sidewall of the core dielectric layer, the lower dielectric layer having a second sidewall that extends beyond the second sidewall of the core dielectric layer;
    a first device die over and bonded to the package substrate;
    a second device die over and bonded to the first device die, wherein the second device die extends beyond a first edge of the first device die, and recedes from a second edge of the first device die, with the first edge and the second edge being opposite edges of the first device die, and the second device die is bonded to the first device die through flip-chip bonding; and
    a molding material molding the first device die therein, wherein the molding material encapsulates the first device die, the first and second sidewalls of the upper dielectric layer and the first and second sidewalls of the core dielectric layer, and wherein the molding material has a first sidewall that is flush with the first sidewall of the lower dielectric layer, and a second sidewall that is flush with the second sidewall of the lower dielectric layer.

11. The package of claim 10, wherein the conductive vias are metal pipes.

12. The package of claim 11, wherein the metal pipes are filled with dielectric material.

13. The package of claim 10, wherein the first conductive features, the second conductive features and the conductive vias are vertically aligned to one another.

14. The package of claim 10, wherein the molding material comprises a top surface contacting a bottom surface of the second device die to form a horizontal interface.

15. The package of claim 10 further comprising an underfill between the first device die and the second device die, wherein the underfill further extends beyond the first edge of the first device die, and recesses from the second edge of the first device die.

16. The package of claim 10, wherein the core of the package substrate further comprises dielectric regions encircled by the conductive vias.

17. The package of claim 10, wherein the lower dielectric comprises polypropylene.

18. A method comprising:
   cutting partially through a wafer-level package substrate form trenches in the wafer-level package substrate, wherein the wafer-level package substrate comprises:
      a core dielectric layer;
      a first dielectric layer overlying and contacting the core dielectric layer, the first dielectric layer being a different material than the core dielectric layer; and
      a second dielectric layer underlying the core dielectric layer, the second dielectric layer being a different material than the core dielectric layer, wherein the trenches extend from a top surface of the first dielectric layer at least partially into the core dielectric layer and do not extend through the second dielectric layer;
   bonding a plurality of dies over the wafer-level package substrate;
   encapsulating the plurality of dies in an encapsulating material to form a wafer-level package; and
   sawing the wafer-level package into a plurality of packages, with each of the plurality of packages comprising a portion of the wafer-level package substrate and one of the plurality of dies.

19. The method of claim 18, wherein cutting partially through the wafer-level package substrate is performed from a first side of the wafer-level package substrate, and wherein sawing the wafer-level package into a plurality of packages is performed from a second side of the wafer-level package opposite the first side.

20. The method of claim 18, wherein sawing the wafer-level package includes:
   a first sawing step sawing through a dielectric layer not cut through in the cutting partially step; and
   after the first sawing step, sawing through the encapsulating material.

* * * * *